(12) United States Patent
Nishiguchi (10) Patent No.: US 12,451,397 B2
(45) Date of Patent: Oct. 21, 2025

(54) SEMICONDUCTOR WAFER AND METHOD FOR MANUFACTURING SEMICONDUCTOR DEVICE

(71) Applicant: Mitsubishi Electric Corporation, Tokyo (JP)

(72) Inventor: Kohei Nishiguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 558 days.

(21) Appl. No.: 17/753,864

(22) PCT Filed: Jan. 21, 2020

(86) PCT No.: PCT/JP2020/001930
§ 371 (c)(1),
(2) Date: Mar. 16, 2022

(87) PCT Pub. No.: WO2021/149151
PCT Pub. Date: Jul. 29, 2021

(65) Prior Publication Data
US 2022/0415726 A1 Dec. 29, 2022

(51) Int. Cl.
*H01L 21/66* (2006.01)
*H01L 21/265* (2006.01)
(Continued)

(52) U.S. Cl.
CPC ........ *H01L 22/30* (2013.01); *H01L 21/26506* (2013.01); *H01L 21/681* (2013.01);
(Continued)

(58) Field of Classification Search
CPC ............... H01L 29/1608; H01L 29/167; H01L 22/30; H01L 22/12; H01L 23/544;
(Continued)

(56) References Cited

U.S. PATENT DOCUMENTS

| | | | |
|---|---|---|---|
| 2007/0190756 A1 | 8/2007 | Uchida | |
| 2011/0241022 A1* | 10/2011 | Masuda | G01V 8/12 438/584 |
| 2015/0214040 A1* | 7/2015 | Celler | H01L 27/1266 438/459 |
| 2016/0218017 A1* | 7/2016 | Nishiguchi | H01L 21/02181 |
| 2017/0213735 A1* | 7/2017 | Imaoka | H10D 62/60 |

(Continued)

FOREIGN PATENT DOCUMENTS

| | | |
|---|---|---|
| CN | 102246265 A | 11/2011 |
| CN | 105047547 A | 11/2015 |

(Continued)

OTHER PUBLICATIONS

International Search Report issued in PCT/JP2020/001930; mailed Apr. 14, 2020.
Office Action issued in JP 2020-528493; mailed by the Japanese Patent Office on Jul. 7, 2020.

(Continued)

*Primary Examiner* — Zandra V Smith
*Assistant Examiner* — Douglas Yap
(74) *Attorney, Agent, or Firm* — Studebaker Brackett PLLC (57) ABSTRACT

A semiconductor wafer device according to the present invention includes a SiC substrate having an upper surface and a rear surface as a surface on the opposite side to the upper surface, and an impurity implantation layer provided on the entire rear surface of the SiC substrate, formed of a same base material as that forming the SiC substrate, including an impurity, and having a lower transmittance of visible light or infrared light than that of the SiC substrate.

6 Claims, 10 Drawing Sheets

(51) Int. Cl.
    *H01L 21/67*     (2006.01)
    *H01L 21/68*     (2006.01)
    *H10D 62/10*     (2025.01)
    *H10D 62/832*     (2025.01)
    *H10D 62/834*     (2025.01)

(52) U.S. Cl.
    CPC ........... *H01L 22/12* (2013.01); *H10D 62/124* (2025.01); *H01L 21/67259* (2013.01); *H10D 62/8325* (2025.01); *H10D 62/834* (2025.01)

(58) Field of Classification Search
    CPC ........... H01L 21/02378; H01L 21/0245; H01L 21/0252; H01L 21/02; H01L 21/52; H01L 21/3148; H01L 21/0445–0495; H01L 21/02167; H01L 21/76859; H01L 21/76862; H01L 21/046–047; H01L 21/2253; H01L 21/0415; H01L 21/265; H01L 21/3115; H01L 21/425; H01L 21/3215; H01L 21/68–682; H01L 21/67242; H01L 21/67259; H01L 21/67265; H10D 62/8325; H10D 62/834; H10D 84/035; H10D 84/03; H10D 30/6741
See application file for complete search history.

(56) References Cited

U.S. PATENT DOCUMENTS

| | | | |
|---|---|---|---|
| 2017/0372965 A1* | 12/2017 | Nishibayashi | H10D 62/8303 |
| 2019/0362972 A1* | 11/2019 | Schulze | H01L 21/02378 |
| 2020/0027797 A1* | 1/2020 | Guo | G01N 27/00 |

FOREIGN PATENT DOCUMENTS

| | | |
|---|---|---|
| CN | 105826167 A | 8/2016 |
| CN | 109449139 A | 3/2019 |
| JP | 2010-141124 A | 6/2010 |
| JP | 2011-049588 A | 3/2011 |
| JP | 2016-136589 A | 7/2016 |
| WO | 2010/067814 A1 | 6/2010 |

OTHER PUBLICATIONS

An Office Action mailed by China National Intellectual Property Administration on Mar. 1, 2025, which corresponds to Chinese Patent Application No. 202080092311.9 and is related to U.S. Appl. No. 17/753,864; with English language translation.

An Office Action mailed by China National Intellectual Property Administration on Sep. 1, 2025, which corresponds to Chinese Patent Application No. 2020800923119 and is related to U.S. Appl. No. 17/753,864; with English language translation.

* cited by examiner

SEMICONDUCTOR WAFER AND METHOD FOR MANUFACTURING SEMICONDUCTOR DEVICE

FIELD

The present invention relates to a semiconductor wafer and a method for manufacturing a semiconductor device.

BACKGROUND

Patent Literature 1 discloses a semiconductor wafer including a sapphire substrate and a silicon thin film formed on one entire surface of the sapphire substrate and composed of a crystalline silicon layer having a device formation region. A silicon oxide film is formed on an entire surface of the silicon thin film. A silicon film is formed on an entire surface on the opposite side to the surface, on which the silicon thin film is formed, of the sapphire substrate. The silicon film has a rough surface formed of an amorphized silicon film and a hemispherical grain polysilicon film. The hemispherical grain polysilicon film scatters transmitted light onto a rear surface of a wafer, thereby making it possible to perform accurate positioning using an optical sensor.

CITATION LIST

Patent Literature

[PTL 1] JP 2011-49588 A

SUMMARY

Technical Problem

In a wafer process device, detection of the presence or absence of a substrate or alignment processing of the substrate may be performed by a substrate recognition sensor. Generally, a Si substrate or a GaAs substrate absorbs red light or infrared light. Accordingly, the presence or absence of the substrate can be detected by detecting the presence or absence of light transmission using a transmission-type photoelectric sensor. In the case of a transparent glass substrate having a high transmittance of red light or infrared light, a reflection-type photoelectric sensor may be used. The reflection-type photoelectric sensor can detect the presence or absence of the substrate with light reflected from the substrate.

For a high-frequency device, a semi-insulating single crystal SiC substrate may be used. The semi-insulating single crystal SiC substrate is transparent. Accordingly, a transmission-type sensor and a reflection-type sensor, described above, cannot generally detect the presence or absence of the substrate.

In Patent Literature 1, a thin film for detecting a substrate is formed on a peripheral portion of the substrate. The thin film may disappear upon being scraped off or peeled off by a variety of processes in a semiconductor manufacturing process. Accordingly, defective detection of the substrate may occur during the manufacturing process.

The present invention has been made to solve the above-described problem, and is directed to obtaining a semiconductor wafer and a method for manufacturing a semiconductor device capable of detecting a substrate using visible light or infrared light and.

Solution to Problem

A semiconductor wafer device according to the first invention of the present application includes a SiC substrate having an upper surface and a rear surface as a surface on the opposite side to the upper surface, and an impurity implantation layer provided on the entire rear surface of the SiC substrate, formed of a same base material as that forming the SiC substrate, including an impurity, and having a lower transmittance of visible light or infrared light than that of the SiC substrate.

A semiconductor wafer device according to the second invention of the present application includes a SiC substrate having an upper surface and a rear surface as a surface on the opposite side to the upper surface, a substrate detection layer provided on the entire rear surface of the SiC substrate and having a lower transmittance of visible light or infrared light than that of the SiC substrate and an impurity implantation layer provided on a peripheral portion of the SiC substrate, including an impurity, and having a lower transmittance of visible light or infrared light than that of the SiC substrate.

A method for manufacturing a semiconductor device according to the third invention of the present application includes performing ion implantation into an entire rear surface of a SiC substrate, to form an impurity implantation layer having a lower transmittance of detection light as visible light or infrared light than that of a base material forming the SiC substrate on a rear surface side of the SiC substrate, irradiating the impurity implantation layer with the detection light, to detect the SiC substrate and forming a semiconductor device on an upper surface side as a surface on the opposite side to the rear surface of the SiC substrate after detecting the SiC substrate.

A method for manufacturing a semiconductor device according to the fourth invention of the present application includes forming, in a SiC substrate having an upper surface and a rear surface as a surface on the opposite side to the upper surface, a substrate detection layer having a lower transmittance of detection light as visible light or infrared light than that of a base material forming the SiC substrate on the entire rear surface of the SiC substrate, performing ion implantation into a peripheral portion of the upper surface of the SiC substrate, to form an impurity implantation layer having a lower transmittance of the detection light than that of the base material forming the SiC substrate, irradiating the substrate detection layer or the impurity implantation layer with the detection light, to detect the SiC substrate and forming a semiconductor device on the upper surface side of the SiC substrate after detecting the SiC substrate.

Advantageous Effects of Invention

In the semiconductor wafer and the method for manufacturing the semiconductor device according to the present invention, a SiC substrate can be detected using visible light or infrared light by an impurity implantation layer.

DESCRIPTION OF EMBODIMENTS

Semiconductor wafers and methods for manufacturing semiconductor devices according to embodiments of the present invention are described with reference to drawings. Identical or corresponding constitutional elements are given the same reference numerals, and the repeated description of such constitutional elements may be omitted.

First Embodiment

Figure 1:
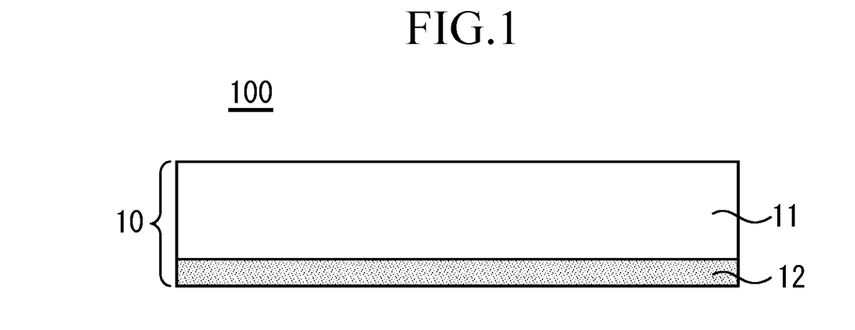
FIG. 1 is a cross-sectional view of a semiconductor wafer according to the first embodiment.

FIG. 1 is a cross-sectional view of a semiconductor wafer 100 according to the first embodiment. The semiconductor wafer 100 includes a SiC substrate 10 having an upper surface and a rear surface as a surface on the opposite side to the upper surface. The SiC substrate 10 is a semi-insulating single crystal SiC substrate. A semiconductor device is formed on the upper surface of the SiC substrate 10.

The SiC substrate 10 is provided with an impurity implantation layer 12 up to its predetermined depth from the entire rear surface. That is, the SiC substrate 10 includes a transparent semi-insulating layer 11 and the impurity implantation layer 12 provided on an entire lower surface of the semi-insulating layer 11. A plurality of epitaxial layers may be formed on the upper surface of the SiC substrate 10.

The impurity implantation layer 12 is provided for substrate detection. The impurity implantation layer 12 is provided in a central portion and a peripheral portion of the SiC substrate 10 in a plan view. The impurity implantation layer 12 is formed of the same base material as that forming the semi-insulating layer 11, and includes an impurity. The impurity implantation layer 12 has a lower transmittance of visible light or infrared light than that of the semi-insulating layer 11. That is, the impurity implantation layer 12 more easily reflects or absorbs visible light or infrared light than the semi-insulating layer 11. Visible light may be red light. The impurity implantation layer 12 may have a larger reflectance of visible light or infrared light than that of the semi-insulating layer 11.

Figure 2:
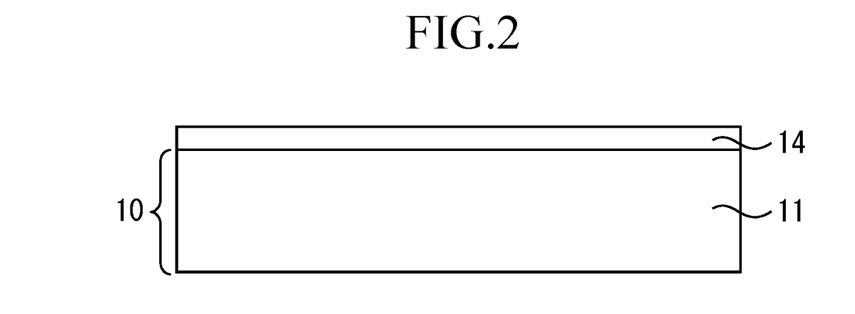
FIG. 2 is a diagram illustrating a state where the protective film is provided on the upper surface of the SiC substrate in the first embodiment.

Then, a method for manufacturing a semiconductor device according to the present embodiment will be described. First, a protective film 14 is formed on the upper surface of the SiC substrate 10. FIG. 2 is a diagram illustrating a state where the protective film 14 is provided on the upper surface of the SiC substrate 10 in the first embodiment. The protective film 14 is provided to protect the SiC substrate 10. The protective film 14 is a SiN film or a SiO film formed using a CVD (chemical vapor deposition) method or a sputtering method, for example. The protective film 14 may be a metal thin film that can be formed using a sputtering method or an evaporation method. The protective film 14 may be a coating material such as polyimide or resist.

Figure 3:
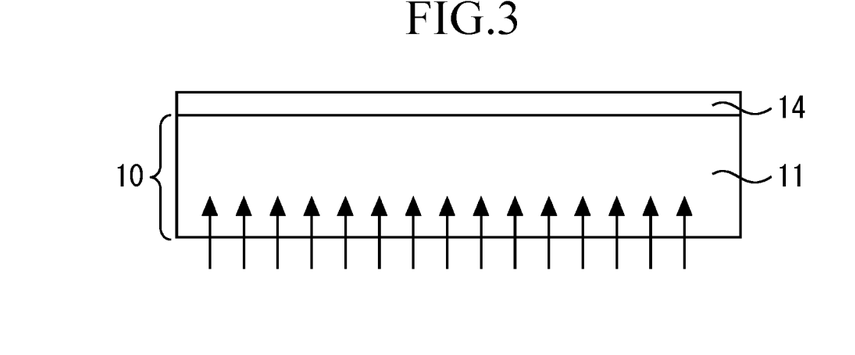
FIG. 3 is a diagram illustrating an ion implantation process according to the first embodiment.
Figure 4:
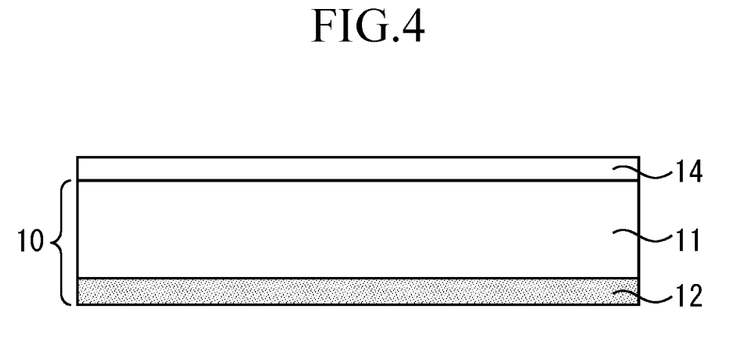
FIG. 4 is a diagram illustrating a state where the impurity implantation layer is formed on the rear surface side of the SiC substrate in the first embodiment.

Then, the impurity implantation layer 12 is formed on the rear surface side of the SiC substrate 10. The impurity implantation layer 12 is formed using an ion implantation method, for example. FIG. 3 is a diagram illustrating an ion implantation process according to the first embodiment. FIG. 4 is a diagram illustrating a state where the impurity implantation layer 12 is formed on the rear surface side of the SiC substrate 10 in the first embodiment. In the ion implantation process, ion implantation is performed on the entire rear surface of the SiC substrate 10.

In a region where the ion implantation has been performed, the transparency of the SiC substrate 10 decreases. That is, the impurity implantation layer 12 having a lower transmittance of detection light, described below, than that of a base material forming the SiC substrate 10 is formed on the rear surface side of the SiC substrate 10. The detection light is visible light or infrared light.

In the ion implantation process, Ar ions, for example, are implanted as an impurity on the rear surface side of the SiC substrate 10. If the type of ions as an impurity is Si ions, N ions, or Al ions, a similar effect can be obtained.

The thickness of the impurity implantation layer 12 required for substrate detection is determined depending on an impurity concentration. The impurity concentration is also referred to as an ion implantation amount or a dose amount. When the dose amount of the Ar ions is $1 \times 10^{16}/cm^2$, if the thickness of the impurity implantation layer 12 is 150 nm, the SiC substrate 10 can be detected. When the dose amount of the Ar ions is $1\times10^{15}/cm^2$, the thickness of the impurity implantation layer 12 is preferably larger than 150 nm.

That is, when the dose amount of an impurity is $1\times10^{16}/cm^2$ or more, the thickness of the impurity implantation layer 12 may be 150 nm or less. When the dose amount of the impurity is $1\times10^{15}/cm^2$ or less, the impurity implantation layer 12 is preferably thicker than 150 nm.

Figure 5:
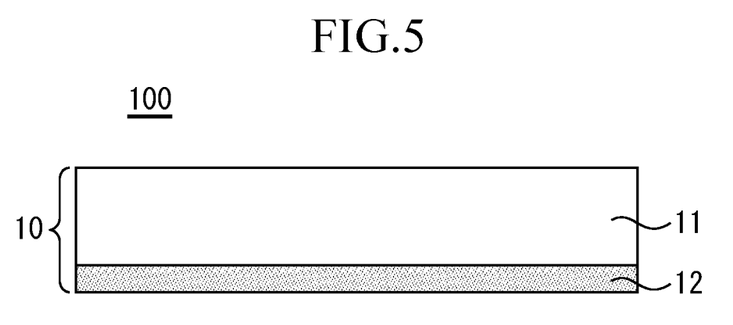
FIG. 5 is a diagram illustrating a state where the protective film has been removed in the first embodiment.

Then, the protective film 14 is removed. FIG. 5 is a diagram illustrating a state where the protective film 14 has been removed in the first embodiment. A method for removing the protective film 14 includes various methods depending on the type of the protective film 14. An etchant such as a HF solution is used for a SiN film or a SiO film. When the protective film 14 is a coating material, the protective film 14 can be removed using an organic solvent or the like. From the foregoing, the semiconductor wafer 100 can be produced.

Figure 6:
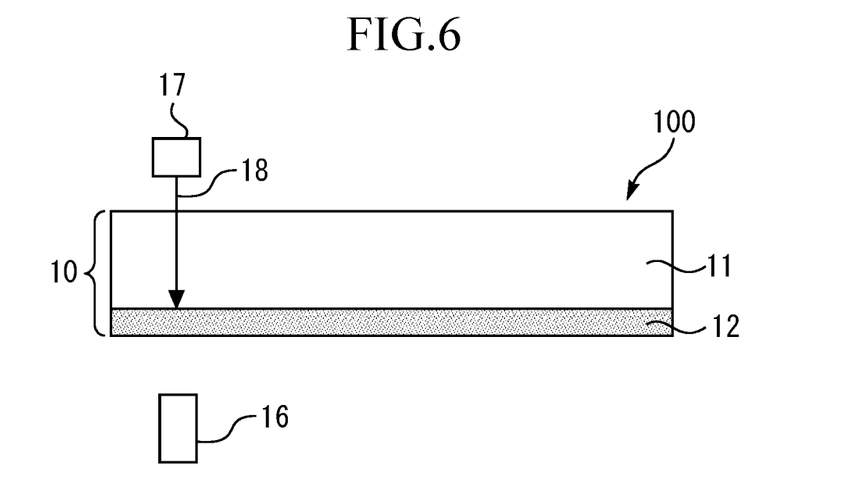
FIG. 6 is a diagram illustrating the detection process in the first embodiment.

Then, a detection process is performed. FIG. 6 is a diagram illustrating the detection process in the first embodiment. In the detection process, the semiconductor wafer 100 is irradiated with detection light 18 from a light source 17. In a manufacturing apparatus, the light source 17 is provided above the semiconductor wafer 100. In the manufacturing apparatus, a sensor 16 is provided below the semiconductor wafer 100.

At this time, the impurity implantation layer 12 is irradiated with the detection light 18, to detect the SiC substrate 10. The impurity implantation layer 12 reflects or absorbs the detection light 18. Accordingly, when the SiC substrate 10 exists between the light source 17 and the sensor 16, the sensor 16 does not detect the detection light 18. When the SiC substrate 10 exists between the light source 17 and the sensor 16, the detection light 18 to be detected by the sensor 16 may be made lower than when the SiC substrate 10 does not exist. Accordingly, the presence or absence of the SiC substrate 10 can be detected.

The sensor 16 may detect the detection light 18 reflected from the impurity implantation layer 12. The sensor 16 may detect the presence or absence of the SiC substrate 10 depending on the presence or absence of reflection from the impurity implantation layer 12.

After the SiC substrate 10 is detected, the semiconductor device is formed on the upper surface side of the SiC substrate 10. The semiconductor device is, for example, a transistor such as a high-frequency device. A circuit may be formed of a resistor or a capacitor or the like on the upper surface of the SiC substrate 10.

After the semiconductor device is formed, the impurity implantation layer 12 is removed. Particularly to form a high-frequency circuit in the high-frequency device, an electrode to be a ground may be formed on a rear surface side of a chip. To connect a front surface electrode and a rear surface-side electrode to each other, a through hole may be formed in the SiC substrate 10. The SiC substrate 10 is thinned by a grinding device to have a thickness suitable for high-frequency circuit design or through hole formation. At the time of thinning processing, the impurity implantation layer 12 is removed.

A compound semiconductor substrate composed of SiC or GaN or the like having a wider band gap than that of Si is generally used for a power device or a high-frequency device. The smaller an impurity content in SiC is, the higher its transparency, and the higher the electrical resistance of its crystal tends to be. In the high-frequency device, a semi-insulating single crystal SiC substrate having a small impurity content in its crystal and having a high transparency may be often used. On the other hand, an n-type SiC substrate, for example, is used in the power device. Accordingly, particularly in a SiC substrate for the high-frequency device, it may be difficult to detect the presence or absence of the substrate using visible light or infrared light.

In a method for manufacturing the semiconductor device using the semi-insulating SiC substrate, a wafer process device for a Si substrate may be used. At this time, a transparent substrate needs to be detected in an existing wafer process device. Accordingly, a thin film of a metal such as Cr, W, or Al having a low transmittance of red light or infrared light may be formed on a rear surface side of the substrate, for example.

A process for manufacturing the semiconductor device generally includes 100 or more processes. The processes include formation of thin films such as a metal thin film and an insulating film and processing of the thin films using an exposure device. For the formation of the thin films, evaporation, sputtering, a CVD, or the like is used. For the processing of the thin films, pattern transfer, dry etching, wet etching, or the like using a photolithographic technique is used. In addition thereto, ion implantation, thermal processing, and the like are performed.

When a metal thin film is formed on a rear surface side of a substrate for substrate detection, the metal thin film may be scraped off by a wide variety of processes, described above. The metal thin film may be altered and peeled off from the substrate. As a result, particularly in the latter half of the manufacturing process, defective detection of the substrate may occur. It is generally difficult to select the metal thin film that can be prevented from being scraped off and altered in all the manufacturing processes.

The semi-insulating single crystal SiC substrate is excellent in chemical stability. In the substrate, an adhesive property between the substrate and the metal thin film is not generally sufficient. Accordingly, when the substrate is conveyed by the semiconductor manufacturing apparatus, the metal thin film may be peeled off from the substrate by contact between the rear surface side of the substrate and a conveyance arm.

Accordingly, in a method for forming the metal thin film on the rear surface side of the substrate, the metal thin film may disappear during manufacturing so that defective detection of the substrate may occur. When the metal thin film is formed a plurality of times to prevent the defective detection of the substrate, this leads to an increase in manufacturing cost.

On the other hand, the impurity implantation layer 12 is used to detect the SiC substrate 10 in the present embodiment. Accordingly, the impurity implantation layer 12 can be prevented from being peeled off by various types of processing during the semiconductor manufacturing process, unlike when the metal thin film is formed on the rear surface of the substrate. Particularly, the impurity implantation layer 12 is formed of the same SiC as a material for the SiC substrate 10. In a wafer process using the SiC substrate, such a process that the SiC substrate is etched is not generally used. Therefore, the impurity implantation layer 12 can be prevented from disappearing during the manufacturing process.

From the foregoing, in the present embodiment, the SiC substrate 10 can be reliably detected using visible light or infrared light. As a result, defective detection of the SiC substrate 10 can be suppressed. The SiC substrate 10 can be detected using the semiconductor manufacturing apparatus used in a standard manufacturing line of a Si device or a GaAs device. Further, film formation processing need not be additionally performed to maintain the impurity implantation layer 12, thereby making it possible to prevent the manufacturing cost from increasing.

In the present embodiment, the impurity implantation layer 12 is formed on the entire surface of the SiC substrate 10. Accordingly, the manufacturing apparatus that performs detection in not only an end portion of the substrate but also a central portion of the substrate can also detect the SiC substrate 10.

In the present embodiment, the impurity implantation layer 12 is a part of the SiC substrate 10. As a modification to this, a substrate detection layer for detecting the SiC substrate 10 may be provided on an entire rear surface of the SiC substrate 10. In this case, the substrate detection layer may be formed of the same base material as that forming the SiC substrate 10, and may include an impurity, and may have a lower transmittance of visible light or infrared light than that of the SiC substrate 10.

Figure 7:
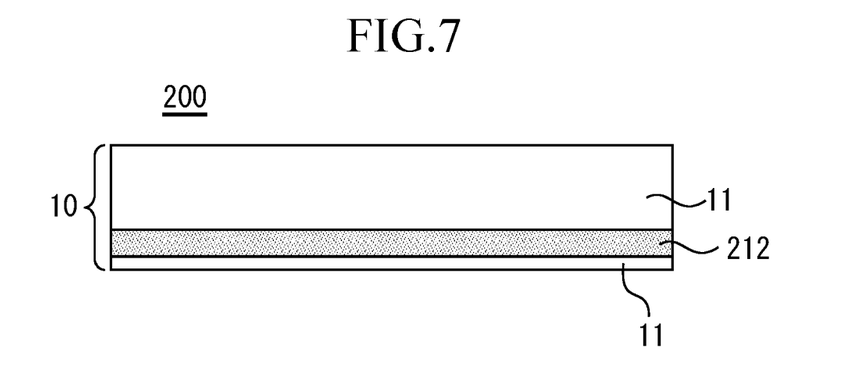
FIG. 7 is a cross-sectional view of a semiconductor wafer according to a modification to the first embodiment.

FIG. 7 is a cross-sectional view of a semiconductor wafer 200 according to a modification to the first embodiment. The semiconductor wafer 200 includes an impurity implantation layer 212. The impurity implantation layer 212 is provided to be sandwiched between semi-insulating layers 11. Thus, the impurity implantation layer 212 may be formed not only in a lowermost layer of the SiC substrate 10 but also away from a rear surface of the SiC substrate 10.

These modifications can be applied, as appropriate, to semiconductor wafers and methods for manufacturing semiconductor devices according to the following embodiments. Note that the semiconductor wafers and the methods for manufacturing the semiconductor devices according to the following embodiments are similar to those of the first embodiment in many respects, and thus differences between the semiconductor wafers and the methods for manufacturing the semiconductor devices according to the following embodiments and those of the first embodiment will be mainly described below.

Second Embodiment

Figure 8:
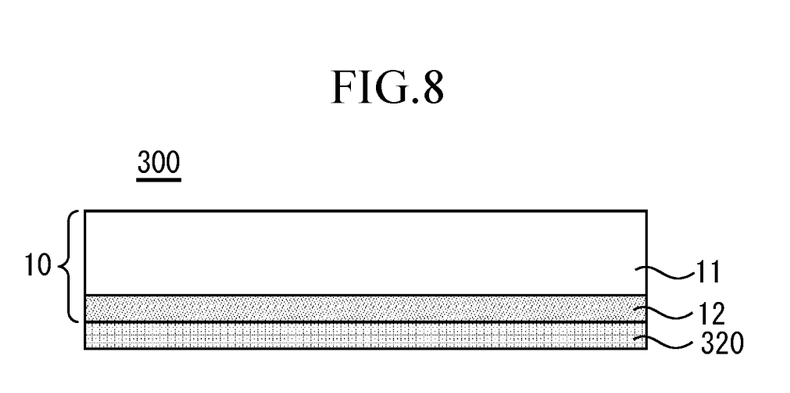
FIG. 8 is a cross-sectional view of a semiconductor wafer according to the second embodiment.

FIG. 8 is a cross-sectional view of a semiconductor wafer 300 according to the second embodiment. The semiconductor wafer 300 includes a metal layer 320 provided below an impurity implantation layer 12. The metal layer 320 covers an entire rear surface of the SiC substrate 10. The metal layer 320 has a lower transmittance of visible light or infrared light than that of a semi-insulating layer 11. Other structures are similar to those of the semiconductor wafer 100 in the first embodiment.

Figure 9:
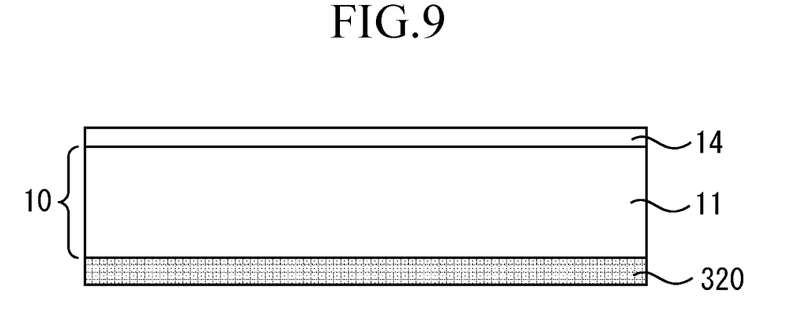
FIG. 9 is a diagram illustrating a state where the protective film is provided on the upper surface of the SiC substrate in the second embodiment.

Then, a method for manufacturing a semiconductor device according to the present embodiment will be described. First, a protective film 14 is formed on an upper surface of the SiC substrate 10. FIG. 9 is a diagram illustrating a state where the protective film 14 is provided on the upper surface of the SiC substrate 10 in the second embodiment.

Then, the metal layer 320 is formed on a rear surface of the SiC substrate 10. The metal layer 320 is formed using a CVD method, an ALD (atomic layer deposition) method, a sputtering method, or an evaporation method. The metal layer 320 is formed of Cr, W, or Al, for example.

Figure 10:
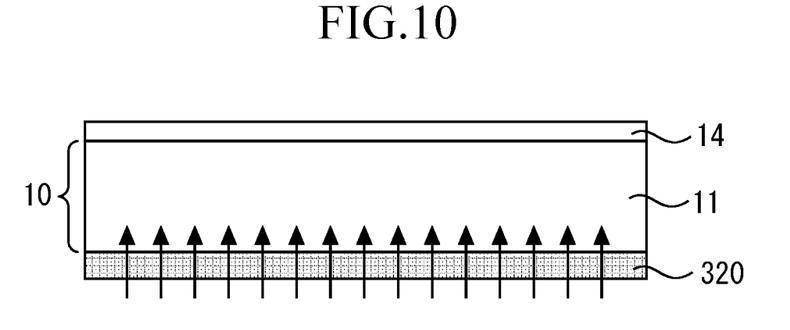
FIG. 10 is a diagram illustrating an ion implantation process according to the second embodiment.
Figure 11:
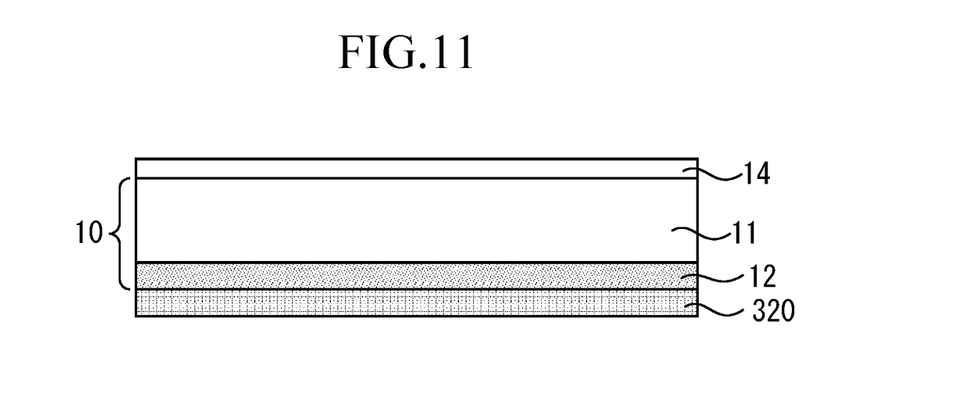
FIG. 11 is a diagram illustrating a state where the impurity implantation layer is formed on the rear surface side of the SiC substrate in the second embodiment.

Then, the impurity implantation layer 12 is formed on the rear surface side of the SiC substrate 10 by ion implantation. FIG. 10 is a diagram illustrating an ion implantation process according to the second embodiment. FIG. 11 is a diagram illustrating a state where the impurity implantation layer 12 is formed on the rear surface side of the SiC substrate 10 in the second embodiment. The ion implantation is performed on the entire rear surface of the SiC substrate 10 through the metal layer 320 with the metal layer 320 formed.

Figure 12:
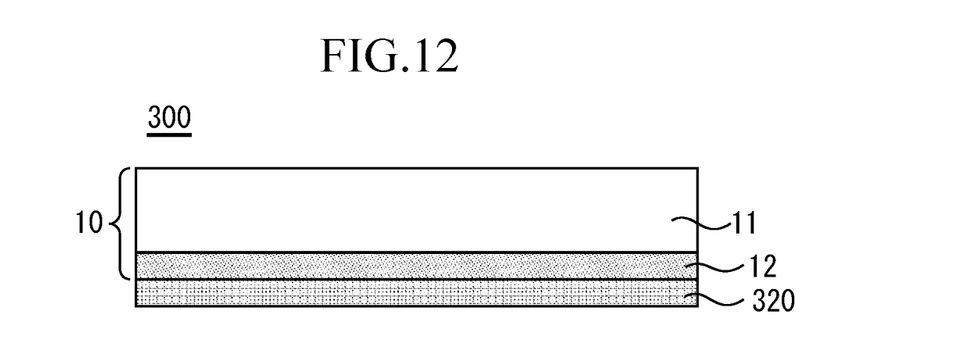
FIG. 12 is a diagram illustrating a state where the protective film has been removed in the second embodiment.

Then, the protective film 14 is removed. FIG. 12 is a diagram illustrating a state where the protective film 14 has been removed in the second embodiment.

In the present embodiment, the metal layer 320 is provided in addition to the impurity implantation layer 12 as a structure for substrate detection. Accordingly, the SiC substrate 10 can be more reliably detected, and defective detection of the SiC substrate 10 can be reduced.

The metal layer 320 may be formed after the impurity implantation layer 12 is formed by the ion implantation.

Third Embodiment

Figure 13:
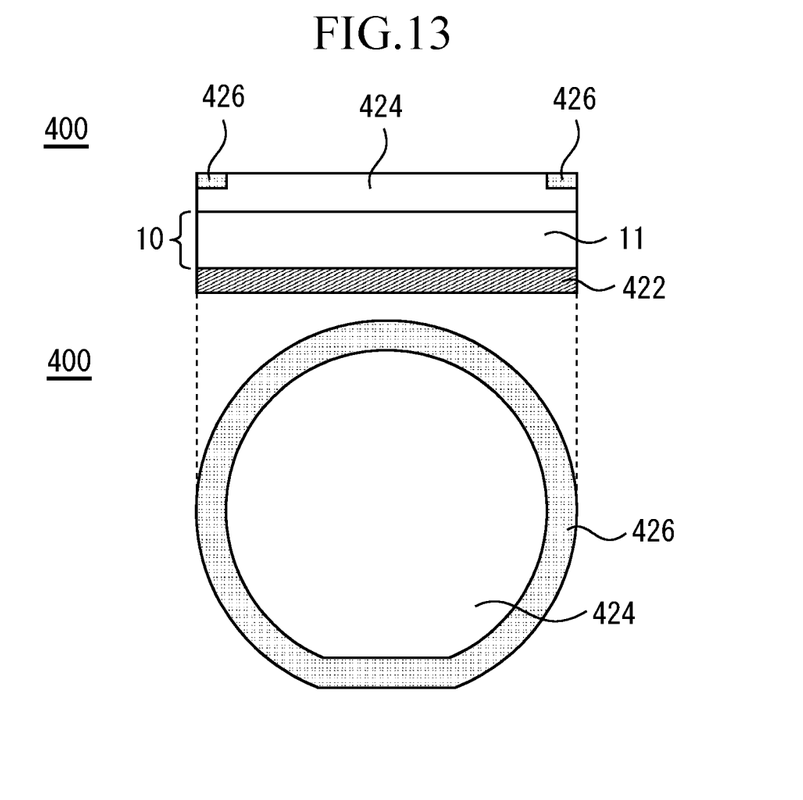
FIG. 13 is a cross-sectional view and a plan view of a semiconductor wafer according to the third embodiment.

FIG. 13 is a cross-sectional view and a plan view of a semiconductor wafer 400 according to the third embodiment. In the semiconductor wafer 400, a substrate detection layer 422 is provided on an entire rear surface of the SiC substrate 10. The substrate detection layer 422 has a lower transmittance of visible light or infrared light than that of the SiC substrate 10. The substrate detection layer 422 is a metal layer formed of Cr, W, or Al, for example.

A crystal growth layer 424 is provided on an upper surface of the SiC substrate 10. An impurity implantation layer 426 is provided in a peripheral portion of the crystal growth layer 424. The impurity implantation layer 426 includes an impurity, and has a lower transmittance of visible light or infrared light than that of the SiC substrate 10. The impurity implantation layer 426 is formed in a region within 5 mm, for example, from an end portion of the crystal growth layer 424 on a peripheral portion of the SiC substrate 10.

Then, a method for manufacturing a semiconductor device according to the present embodiment will be described. First, epitaxial growth is performed on the SiC substrate 10, to form the crystal growth layer 424. The epitaxial growth is performed using an MOCVD (metal organic chemical vapor deposition) method, for example. When the semiconductor device is a high-frequency device, a plurality of layers composed of AN, GaN, AlGaN, or the like are formed as the crystal growth layer 424.

Figure 14:
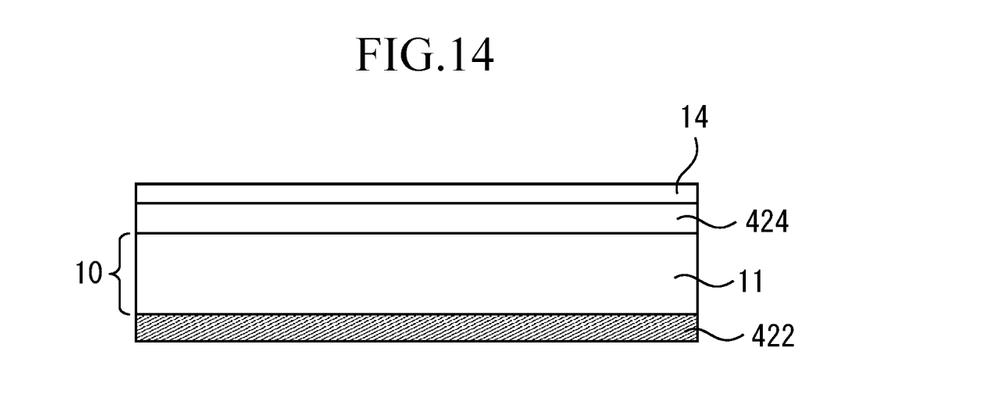
FIG. 14 is a diagram illustrating a state where the protective film is provided on the upper surface of the crystal growth layer in the third embodiment.

Then, a protective film 14 is formed on an upper surface of the crystal growth layer 424. FIG. 14 is a diagram illustrating a state where the protective film 14 is provided on the upper surface of the crystal growth layer 424 in the third embodiment. The protective film 14 in the present embodiment is preferably a SiN film or a SiO film formed by a CVD method, a sputtering method, or an evaporation method. The protective film 14 has its object to protect a surface of a semiconductor layer from contamination when a photoresist 428, described below, is formed. The substrate detection layer 422 is formed on the entire rear surface of the SiC substrate 10.

Figure 15:
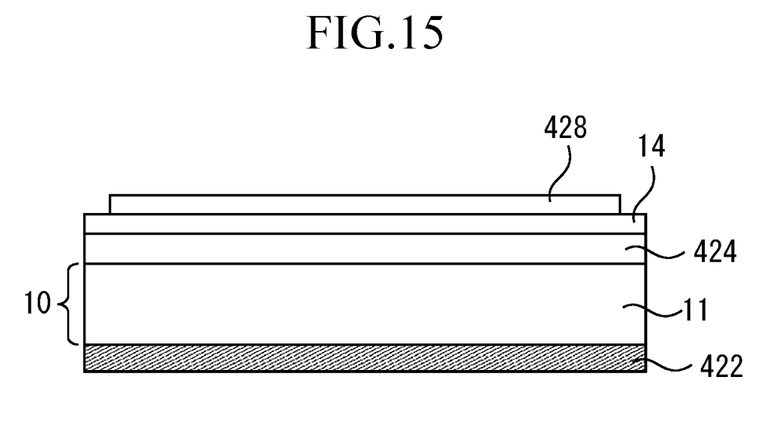
FIG. 15 is a diagram illustrating a state where the photoresist is formed in the third embodiment.

Then, the photoresist 428 is applied onto the protective film 14. Then, the photoresist 428 in a region within 5 mm from an end portion of the SiC substrate 10 is removed using a photolithographic method. FIG. 15 is a diagram illustrating a state where the photoresist 428 is formed in the third embodiment.

Figure 16:
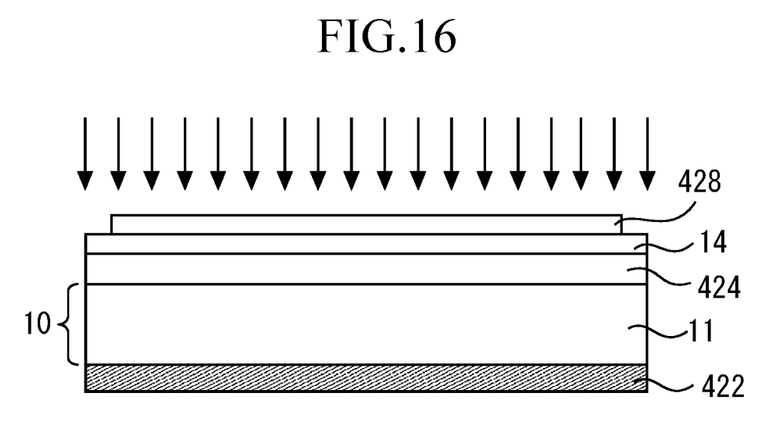
FIG. 16 is a diagram illustrating the ion implantation process according to the third embodiment.

Then, an ion implantation process is performed. FIG. 16 is a diagram illustrating the ion implantation process according to the third embodiment. In the ion implantation process, ion implantation is performed in a peripheral portion of the upper surface of the crystal growth layer 424, to form the impurity implantation layer 426. Ion implantation is performed from the upper surface side of the crystal growth layer 424 so that ions are implanted into a region other than a portion masked with the photoresist 428 in the crystal growth layer 424. In the ion implantation process, the type and the dose amount of the ions and the thickness of the impurity implantation layer 426 are similar to those in the first embodiment, for example.

Figure 17:
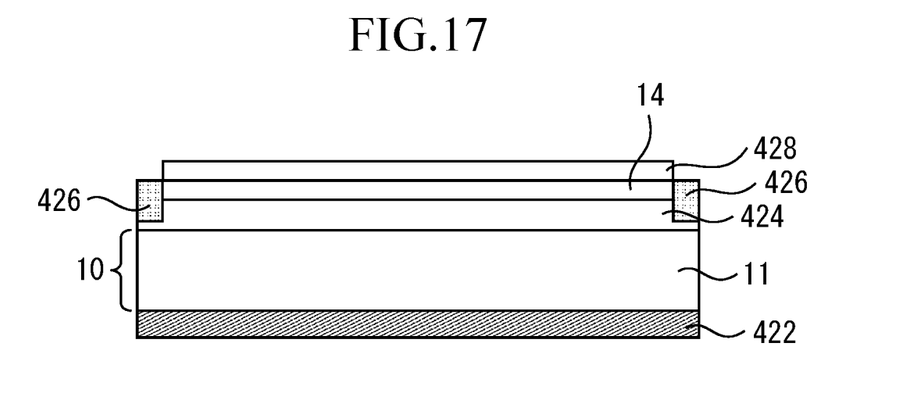
FIG. 17 is a diagram illustrating a state where the impurity implantation layer is formed in the crystal growth layer in the third embodiment.

FIG. 17 is a diagram illustrating a state where the impurity implantation layer 426 is formed in the crystal growth layer 424 in the third embodiment. The impurity implantation layer 426 has a lower transmittance of detection light 18 than that of the SiC substrate 10. The impurity implantation layer 426 may have a lower transmittance of the detection light 18 than that of a portion, other than the impurity implantation layer 426, in the crystal growth layer 424.

Then, the photoresist 428 and the protective film 14 are removed. The film thickness of the photoresist 428 is determined depending on an ion implantation condition in forming the impurity implantation layer 426. The film thickness of the photoresist 428 is set such that ions do not reach the upper surface of the SiC substrate 10 with acceleration energy at the time of the ion implantation. The impurity implantation layer 426 is formed outside a device formation region.

Then, the substrate detection layer 422 or the impurity implantation layer 426 is irradiated with the detection light 18, to detect the SiC substrate 10. After the SiC substrate 10 is detected, processing on the upper surface side of the SiC substrate 10 is performed, to form the semiconductor device. After the semiconductor device is formed, the substrate detection layer 422 is removed.

In the present embodiment, the impurity implantation layer 426 is formed only in the peripheral portion of the crystal growth layer 424. Accordingly, the impurity implantation layer 426 is effective for a manufacturing apparatus that detects a substrate in a peripheral portion of the substrate. In the manufacturing apparatus that detects the substrate in a central portion of the substrate, detection is performed using the substrate detection layer 422.

The substrate detection layer 422 may be used for detecting the SiC substrate 10 in forming the protective film 14, the photoresist 428, and the impurity implantation layer 426. In this case, the substrate detection layer 422 is formed before the protective film 14 is formed.

When an impurity implantation layer is formed on the rear surface side of the SiC substrate 10, the substrate needs to be turned over and processed. In the present embodiment, the impurity implantation layer 426 is formed on the upper surface side of the SiC substrate 10. Accordingly, the SiC substrate 10 need not be turned over when the impurity implantation layer 426 is formed. This can result in improved productivity.

The substrate detection layer 422 as a metal layer is easily peeled off particularly in the peripheral portion of the SiC substrate 10. In the present embodiment, the impurity implantation layer 426 for substrate detection is formed in the outer periphery of the crystal growth layer 424. Accordingly, even if the substrate detection layer 422 is peeled off in the peripheral portion of the SiC substrate 10, a substrate detection function can be compensated for by the crystal growth layer 424.

The impurity implantation layer 426 is formed to a predetermined depth from the upper surface of the crystal growth layer 424. The impurity implantation layer 426 is not limited to this, but may be formed from a position deeper than the upper surface of the crystal growth layer 424.

The substrate detection layer 422 is not limited to a metal layer. The substrate detection layer 422 may be an impurity implantation layer provided on the entire rear surface side of the SiC substrate 10, like in the first embodiment. In this case, the impurity implantation layer has a lower transmittance of visible light or infrared light than that of a base material forming the SiC substrate 10.

Fourth Embodiment

Figure 18:
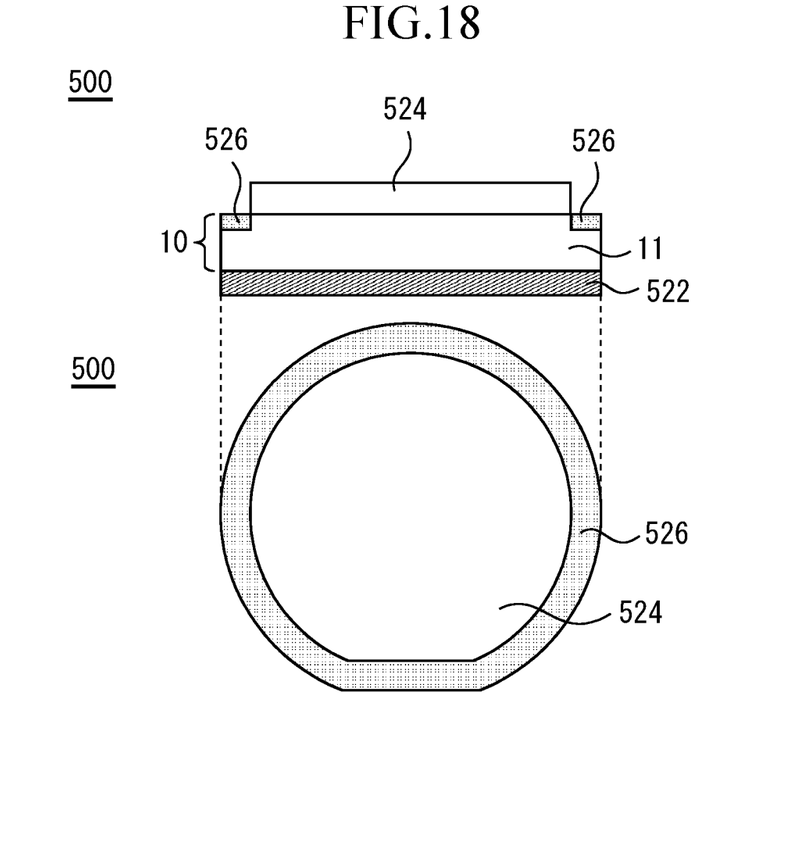
FIG. 18 is a cross-sectional view and a plan view of a semiconductor wafer according to the fourth embodiment.

FIG. 18 is a cross-sectional view and a plan view of a semiconductor wafer 500 according to the fourth embodiment. In the semiconductor wafer 500, a substrate detection layer 522 is provided on an entire rear surface of a SiC substrate 10. The substrate detection layer 522 is a metal layer, for example, and has a lower transmittance of visible light or infrared light than that of a semi-insulating layer 11.

An impurity implantation layer 526 is provided on the side of an upper surface of a peripheral portion of the SiC substrate 10. The impurity implantation layer 526 includes an impurity, and has a lower transmittance of visible light or infrared light than that of the semi-insulating layer 11. The impurity implantation layer 526 is formed of the same base material as that forming the SiC substrate 10. The impurity implantation layer 526 is formed in a region within 5 mm, for example, from an end portion of the SiC substrate 10. A crystal growth layer 524 is provided on the inner side of the impurity implantation layer 526 on the upper surface of the SiC substrate 10.

Figure 19:
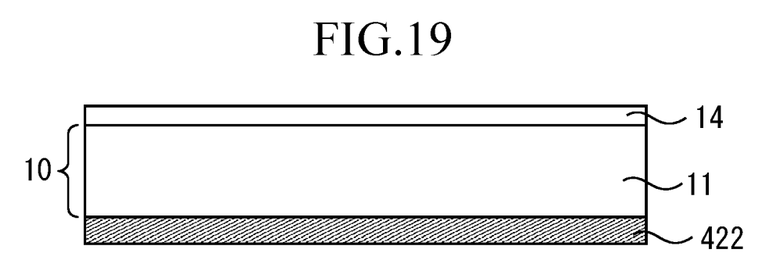
FIG. 19 is a diagram illustrating a state where the protective film is provided on the upper surface of the SiC substrate in the fourth embodiment.

Then, a method for manufacturing a semiconductor device according to the present embodiment will be described. First, a protective film 14 is formed on the upper surface of the SiC substrate 10. A substrate detection layer 422 is formed on the entire rear surface of the SiC substrate 10. FIG. 19 is a diagram illustrating a state where the protective film 14 is provided on the upper surface of the SiC substrate 10 in the fourth embodiment.

Figure 20:
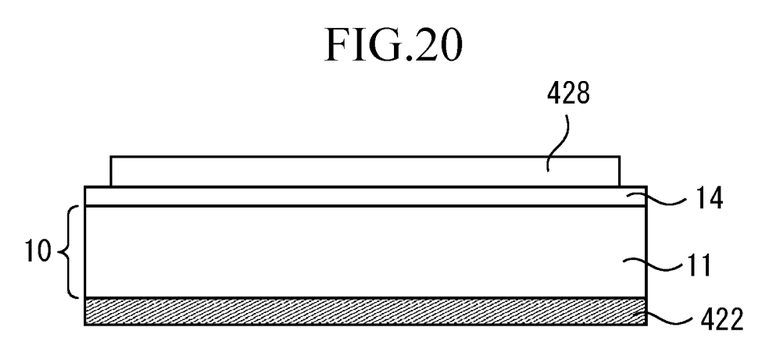
FIG. 20 is a diagram illustrating a state where the photoresist is formed in the fourth embodiment.

Then, a photoresist 428 is formed on the protective film 14, excluding the region within 5 mm from the end portion of the SiC substrate 10, using a photolithographic method. FIG. 20 is a diagram illustrating a state where the photoresist 428 is formed in the fourth embodiment.

Figure 21:
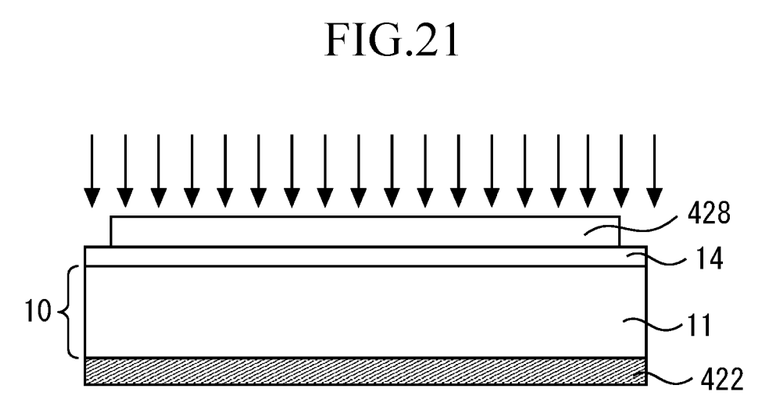
FIG. 21 is a diagram illustrating an ion implantation process according to the fourth embodiment.
Figure 22:
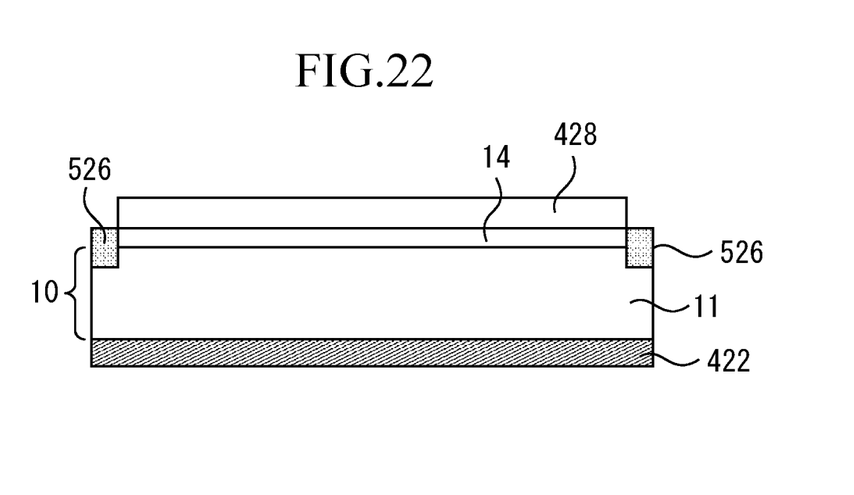
FIG. 22 is a diagram illustrating a state where the impurity implantation layer is formed in the SiC substrate in the fourth embodiment.

Then, an ion implantation process is performed. FIG. 21 is a diagram illustrating an ion implantation process according to the fourth embodiment. In the ion implantation process, ion implantation is performed in the peripheral portion on the upper surface of the SiC substrate 10 using the photoresist 428 as a mask. As a result, an impurity implantation layer 526 having a lower transmittance of detection light 18 than that of the base material forming the SiC substrate 10 is formed. FIG. 22 is a diagram illustrating a state where the impurity implantation layer 526 is formed in the SiC substrate 10 in the fourth embodiment. Then, the photoresist 428 is removed.

Figure 23:
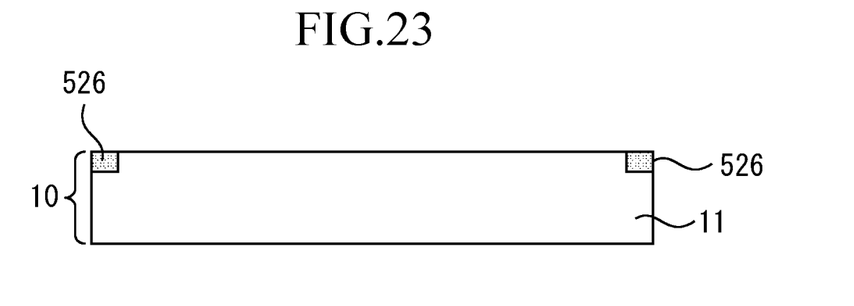
FIG. 23 is a diagram illustrating a state where the protective film has been removed in the fourth embodiment.

Then, the protective film 14 and the substrate detection layer 422 are removed. FIG. 23 is a diagram illustrating a state where the protective film 14 has been removed in the fourth embodiment. The substrate detection layer 422 can be preferably simultaneously removed when the protective film 14 is removed. When the protective film 14 is composed of SiN or SiO, for example, Ti or Al may be used for the substrate detection layer 422.

Figure 24:
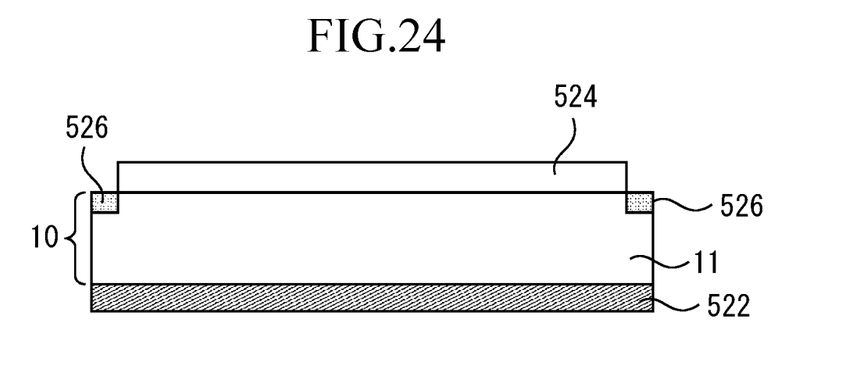
FIG. 24 is a diagram illustrating a state where the crystal growth layer is formed in the fourth embodiment.

Then, the crystal growth layer 524 is grown on the upper surface of the SiC substrate 10. The substrate detection layer 522 is formed on the rear surface of the SiC substrate 10. FIG. 24 is a diagram illustrating a state where the crystal growth layer 524 is formed in the fourth embodiment. The crystal growth layer 524 functions as a semiconductor layer of a device. The crystal growth layer 524 is formed using an MOCVD method, for example.

The crystal growth layer 524 is formed in a region other than a region where the impurity implantation layer 526 is formed. Generally, a crystal growth layer is formed on a crystal layer. Here, an impurity implantation layer formed in single crystal SiC has been amorphized. Accordingly, the crystal growth layer 524 is formed only in a crystal region other than the impurity implantation layer 526.

In the present embodiment, the impurity implantation layer 526 is formed in the SiC substrate 10. Accordingly, the impurity implantation layer 526 effective for substrate detection can be obtained regardless of a material for and a structure of the crystal growth layer 524.

The crystal growth layer 524 is epitaxially grown at a high temperature of 800° C. or more, for example. At this time, the substrate detection layer 422 as a metal layer is removed before being epitaxially grown to avoid metal contamination in a furnace. After the epitaxial growth, the substrate detection layer 522 as a metal thin film is formed again to be able to detect the presence or absence of a wafer in the vicinity of the center of a wafer. If there is no problem in the quality of an epitaxial layer, the substrate detection layer 422, together with the protective film, need not be removed.

Note that the technical features described in the above embodiments may be combined as appropriate.

REFERENCE SIGNS LIST

10 SiC substrate, 11 semi-insulating layer, 12 impurity implantation layer, 14 protective film, 16 sensor, 17 light source, 18 detection light, 100 semiconductor wafer, 200 semiconductor wafer, 212 impurity implantation layer, 300 semiconductor wafer, 320 metal layer, 400 semiconductor wafer, 422 substrate detection layer, 424 crystal growth layer, 426 impurity implantation layer, 428 photoresist, 500 semiconductor wafer, 522 substrate detection layer, 524 crystal growth layer, 526 impurity implantation layer

The invention claimed is:

1. A semiconductor wafer comprising:
   a SiC substrate having an upper surface and a rear surface as a surface on the opposite side to the upper surface; and
   an impurity implantation layer formed of a same base material as that forming the SiC substrate, including an impurity, and having a lower transmittance of visible light or infrared light than that of the SiC substrate,
   wherein the entire rear surface of the SiC substrate is the impurity implantation layer, and
   the semiconductor wafer further comprises a metal layer provided below the impurity implantation layer and directly contacting the impurity implantation layer.

2. The semiconductor wafer according to claim 1, wherein the metal layer covers the entire rear surface of the SiC substrate.

3. The semiconductor wafer according to claim 1, wherein the SiC substrate is a semi-insulating single crystal SiC substrate.

4. The semiconductor wafer according to claim 1, wherein the impurity includes Ar ions, Si ions, N ions, or Al ions.

5. The semiconductor wafer according to claim 1, wherein a dose amount of the impurity is $1 \times 10^{16}/cm^2$ or more, and a thickness of the impurity implantation layer is 150 nm or less.

6. The semiconductor wafer according to claim 1, wherein a dose amount of the impurity is $1 \times 10^{15}/cm^2$ or less, and the impurity implantation layer is thicker than 150 nm.

* * * * *